(12) United States Patent
Stephanson

(10) Patent No.: US 8,768,639 B2
(45) Date of Patent: Jul. 1, 2014

(54) DYNAMICALLY SELF-ADJUSTING MAGNETOMETER

(71) Applicant: Broadband Discovery Systems, Inc., Scotts Valley, CA (US)

(72) Inventor: Cory James Stephanson, La Selva Beach, CA (US)

(73) Assignee: Broadband Discovery Systems, Inc., Scotts Valley, CA (US)

( * ) Notice: Subject to any disclaimer, the term of this patent is extended or adjusted under 35 U.S.C. 154(b) by 0 days.

(21) Appl. No.: 14/027,046

(22) Filed: Sep. 13, 2013

(65) Prior Publication Data

US 2014/0032155 A1 Jan. 30, 2014

Related U.S. Application Data

(63) Continuation of application No. 12/961,302, filed on Dec. 6, 2010, now Pat. No. 8,560,259.

(51) Int. Cl.
*G06F 19/00* (2011.01)
*G01R 33/00* (2006.01)
*G01R 33/028* (2006.01)
*G01R 35/00* (2006.01)

(52) U.S. Cl.
CPC .......... *G01R 33/0035* (2013.01); *G01R 33/028* (2013.01); *G01R 35/00* (2013.01)
USPC ............... 702/85; 702/94; 702/153; 324/240; 324/230; 324/207.17; 324/262; 324/247

(58) Field of Classification Search
USPC .............. 702/85, 94, 153; 324/240, 230, 227, 324/207.17, 237, 233, 239, 251, 529, 260, 324/261, 262, 247, 207.15, 346, 202, 207.2, 324/235; 33/319, 355 R
See application file for complete search history.

(56) References Cited

U.S. PATENT DOCUMENTS

| | | | | |
|---|---|---|---|---|
| 4,767,988 | A * | 8/1988 | Wilson ......................... | 324/247 |
| 5,182,514 | A * | 1/1993 | Rice, Jr. ....................... | 324/244 |
| 5,453,689 | A * | 9/1995 | Goldfine et al. .............. | 324/239 |
| 5,629,621 | A * | 5/1997 | Goldfine et al. .............. | 324/239 |
| 5,990,677 | A * | 11/1999 | Goldfine et al. .............. | 324/239 |
| 6,252,398 | B1 * | 6/2001 | Goldfine et al. .............. | 324/239 |
| 6,430,513 | B1 * | 8/2002 | Wang et al. ................... | 702/28 |
| 6,433,542 | B2 * | 8/2002 | Goldfine et al. .............. | 324/239 |
| 6,982,697 | B2 * | 1/2006 | Wilson et al. ................. | 345/156 |
| 7,250,936 | B2 * | 7/2007 | Wilson et al. ................. | 345/156 |
| 7,259,550 | B2 * | 8/2007 | Bergsma ....................... | 324/202 |
| 7,696,748 | B2 * | 4/2010 | Schlicker et al. ............. | 324/240 |
| 2001/0054894 | A1 * | 12/2001 | Goldfine et al. ......... | 324/207.17 |
| 2003/0193572 | A1 * | 10/2003 | Wilson et al. ............ | 348/207.99 |
| 2005/0110751 | A1 * | 5/2005 | Wilson et al. ................ | 345/156 |
| 2007/0123806 | A1 * | 5/2007 | Bouvier et al. .............. | 600/595 |
| 2008/0071492 | A1 * | 3/2008 | Skvortsov et al. ............. | 702/92 |
| 2009/0322325 | A1 * | 12/2009 | Ausserlechner ............. | 324/260 |
| 2012/0242535 | A1 * | 9/2012 | Kanamoto .................... | 342/158 |

* cited by examiner

*Primary Examiner* — Carol S Tsai

(57) ABSTRACT

A dynamically self-adjusting magnetometer is disclosed. In one embodiment, a first sample module periodically generates an electronic signal related to at least one magnetic field characteristic of a monitored environment. A second sample module periodically generates an electronic signal related to at least one magnetic field characteristic of a monitored environment. A summing module sums the absolute value of the electronic signal from the first sample module and the electronic signal from the second sample module. A delta comparator module receives the electronic signals from each of the first sample module, the second sample module and the summing module and compares each of the electronic signals with a previously received set of electronic signals to establish a change, wherein an output is generated if the change is greater than or equal to a threshold.

10 Claims, 9 Drawing Sheets

DYNAMICALLY SELF-ADJUSTING MAGNETOMETER

CROSS REFERENCE TO RELATED APPLICATIONS

The present patent application is a continuation of U.S. patent application Ser. No. 12/961,302, filed Dec. 6, 2010, entitled "Dynamically Self-Adjusting Magnetometer," by Cory J. Stephanson assigned to the assignee of the present application and incorporated in its entirety herein.

TECHNICAL FIELD

The field of the present invention relates to a dynamically self-adjusting magnetometer.

BACKGROUND

Presently, magnetometers are utilized in numerous environments and for numerous purposes including, safety, defense, detection, environment monitoring and the like.

In addition, magnetometers are sophisticated in operation, calibration and even maintenance. As such, training personnel in the operation of magnetometers including application, the proper methodology of use, calibration and repair is a significant investment in time, training and cost. Moreover, if the magnetometers is miss-calibrated, improperly installed, incorrectly located, or the like, detection capabilities of the magnetometers can become significantly reduced.

For example, an out of calibration, miss-calibrated or improperly located magnetometers can result in improper detection of ferrous metals in an environment. This can results in a reduced sensitivity of the magnetometer that may remain unknown to the user.

A second problem with an out of calibration, miss-calibrated or improperly located magnetometer is that once the error is realized, the area monitored by the magnetometer must either be closed to access or else a significant reduction in traffic flow is implemented as previously automated tasks are now performed by operators utilizing handheld devices, or the like. Thus, if a user was unsure that the sensor was not operating within calibration and specification characteristics, numerous liability issues would prompt the user to shut down the system for inspection and/or repair.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A dynamically self-adjusting magnetometer is disclosed. In one embodiment, a first sample module periodically generates an electronic signal related to at least one magnetic field characteristic of a monitored environment. A second sample module periodically generates an electronic signal related to at least one magnetic field characteristic of a monitored environment. A summing module sums the absolute value of the electronic signal from the first sample module and the electronic signal from the second sample module. A delta comparator module receives the electronic signals from each of the first sample module, the second sample module and the summing module and compares each of the electronic signals with a previously received set of electronic signals to establish a change, wherein an output is generated if the change is greater than or equal to a threshold.

DETAILED DESCRIPTION

Reference will now be made in detail to embodiments of the present technology, examples of which are illustrated in the accompanying drawings. While the technology will be described in conjunction with various embodiments, it will be understood that they are not intended to limit the present technology to these embodiments. On the contrary, the presented technology is intended to cover alternatives, modifications and equivalents, which may be included within the spirit and scope the various embodiments as defined by the appended claims.

Furthermore, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the present embodiments.

Overview

A dynamically self-adjusting magnetometer is described. In one embodiment, the dynamically self-adjusting magnetometer is well suited to stand-alone operation as well as integration with legacy/future technology.

In general, dynamically self-adjusting refers to the sensor's ability to calibrate for change in environmental monitored characteristics. In other words, the capability to adjust
} to changes in monitored conditions without requiring manual recalibration of the sensor, disconnection of the sensor or repeated false warnings from the sensor. Thus, the dynamic self-adjusting characteristics allow the dynamically self-adjusting magnetometer to adjust over time to changes in the environments magnetic field.

Moreover, these changes may be specific to the thing being monitored or may be generic to the environment around whatever is being monitored.

The following discussion includes an overview of environments that may be monitored, a general description of a self-adjusting sensor and then a specific discussion of the dynamically self-adjusting magnetometer.

Monitored Environment

Figure 1:
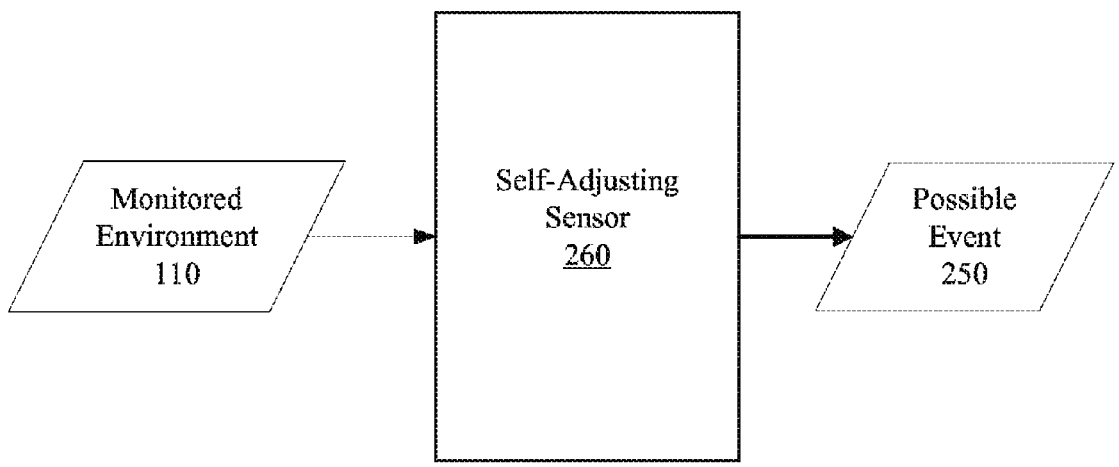
FIG. 1 is a block diagram of one embodiment for monitoring a magnetic field in an environment is shown in accordance with one embodiment of the present technology.

With reference to FIG. 1, a block diagram 100 of one embodiment for monitoring an environment is shown. In one embodiment, FIG. 1 includes a monitored environment 110, a dynamically self-adjusting sensor 260 and a possible event 250.

In general, monitored environment 110 is a localized area or portion of an environment, similar to an ecosystem. For example, monitored environment 110 may be an outdoor area, an indoor area, or a combination thereof. For example, monitored environment 110 could be a building, a room, a piece of machinery, a pipeline, a yard, a pool, or the like that a user would want monitored. Additionally, part or all of monitored environment 110 may be dry, partially or completely submerged, partially or completely buried, and the like.

Usually, the magnetic field of monitored environment 110 will have a certain baseline for any given period of time. However, it is not uncommon for the baseline of the magnetic field of a monitored environment 110 to change over time. Generally, baseline changes in the magnetic field of a monitored environment 110 can be changes that occur over a longer period of time than a possible event change. For example, temperature changes, weather changes, solar activity and the like.

Dynamically self-adjusting sensor 260 monitors monitored environment 110 to recognize an event. When dynamically self-adjusting sensor 260 identifies a change in monitored environment 110 due to an event, possible event 250 is generated. In one embodiment, dynamically self-adjusting sensor 260 utilizes a relative change methodology instead of explicit field strength values of monitored environment 110.

In one embodiment, self-adjusting sensor 260 is powered by means of an electrical power source. This electrical power source may comprise an internal power source, such as a system battery, or an external power source, such as a transmission line that delivers alternating current and that may be accessed through an electrical wall socket. The description of a number of power sources is provided for purposes of clarity; however, the possible power sources may be other electrical types, chemical based, solar based or the like. Thus, the technology is well suited to alternate powering methods in accordance with the present invention. Further, the sensor described herein may be small and portable, e.g., reduced power requirements possibly having a shorter range; larger vehicle deployed, e.g., increased power requirements, thereby increasing the range; or may be hard mounted, such as on or in a building or other structure. In one embodiment, dynamically self-adjusting sensor 260 may be selectively powered up and selectively powered-down to extend battery life.

Generic Dynamically Self-Adjusting Sensor

Figure 2:
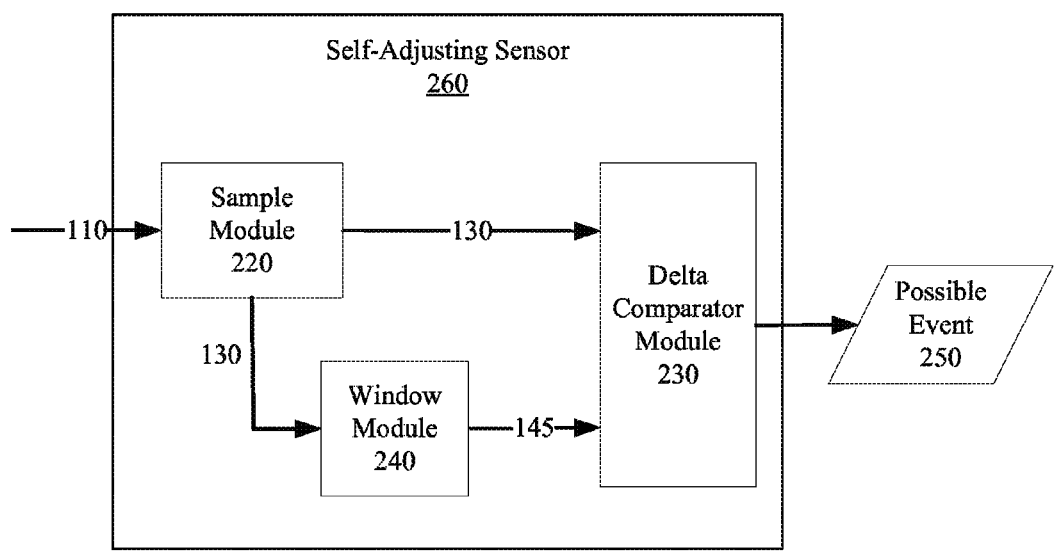
FIG. 2 is a block diagram of a dynamically self-adjusting sensor shown in accordance with one embodiment of the present technology.

With reference now to FIG. 2, a block diagram 200 of a self-adjusting sensor 260 is shown in accordance with one embodiment. In one embodiment, dynamically self-adjusting sensor 260 includes a sample module 220, delta comparator module 230, and window module 240.

As stated herein, self-adjusting sensor 260 may be, but is not limited to, an optical sensor, a magnetic sensor, an acoustic sensor, and the like.

In one embodiment, sample module 220 samples monitored environment 110 periodically at a pre-defined rate of time and generates a signal 130 for each sampling period. In one embodiment, signal 130 may be generated at a consistent interval. For example, sample module 220 may generate signal 130 every few milliseconds, few minutes, few seconds, few hours or the like. By adjusting the signal interval for sample module 220, both sensitivity and range of dynamically self-adjusting sensor 260 may be adjusted.

For example, sample module 220 may use a 1 MHz crystal to establish a nanosecond sample rate. In one embodiment, sample module 220 outputs a signal 130 to delta comparator module 230. In addition, sample module 220 also outputs a signal 130 to window module 240 and delta comparator module 230.

Referring still to FIG. 2, in one embodiment, window module 240 provides an average signal 145 over a pre-defined number of signals. The average signal 145 is provided to delta comparator module 230 and is utilized by delta comparator module 230 to detect changes in monitored environment 110.

In one embodiment, delta comparator module 230 receives a signal 130 from sample module 220 at given intervals and compares the signals. For example, after delta comparator module 230 receives at least a second signal, delta comparator module 230 will compare the two signals and generate a delta or difference between the two signals, as shown and described in more detail in FIGS. 4-5 herein. Thus, since in one embodiment, delta comparator module 230 performs a comparison between the most recent signal and the next most recent signal 440, a dynamically self-adjusted baseline for the particular monitored environment 110 is maintained. Further, the delta value generated by delta comparator module 230 may be a relative value. As such, an explicit value for the signal 130 is not required. When the resultant difference between compared signals is greater than or equal to a pre-defined difference threshold, delta comparator module 230 provides a possible event 250 output.

With respect to average signal 145, in one embodiment, delta comparator module 230 receives average signal 145 from window module 240 and compares average signal 145 with a previous average signal 145, signal 130, or the like. For example, after delta comparator module 230 receives at least a second average signal 145, delta comparator module 230 will compare the two average signals 145 and generate a delta or difference between the two average signals 145, as shown and described in more detail in FIGS. 4-5 herein. In another embodiment, after delta comparator module 230 receives an average signal 145, delta comparator module 230 may compare the average signal 145 with a signal 130 and generate a delta or difference between the average signal 145 and the signal 130. Again, since similar signals are being compared and it is the change or difference that is utilized, the delta value generated by delta comparator module 230 may be a relative value. As such, an explicit value for signal 130 or average signal 145 is not required. When the resultant delta is greater than or equal to a pre-defined difference threshold, delta comparator module 230 outputs a tangible, concrete possible event 250. Examples of an output of possible event 250 include, but are not limited to, a printout, a visual and/or audio signal, an output to a graphical user interface (GUI), or the like.

Although, in one embodiment, neither signal 130 nor average signal 145 need include a specific or quantified value for monitored environment 110 as long as sample module 220 provides a consistent representation of monitored environment 110 in signal 130. However, in another embodiment, signal 130 and/or average signal 145 may include a specified value related to monitored environment 110.

In one embodiment, delta comparator module 230 may monitor a plurality of average signals 145 over time to detect changes in monitored environment 110 over time. In yet another embodiment, the functions described herein as being performed by a single delta comparator module 230 may be performed by more than one delta comparator module 230 or may be performed by the same device that performs the operations of sample module 220 and/or window module 240. However, for purposes of clarity, block comparator 230 is shown as a single module and is described herein as separate from sample module 220 and window module 240.

Operation

Figure 3:
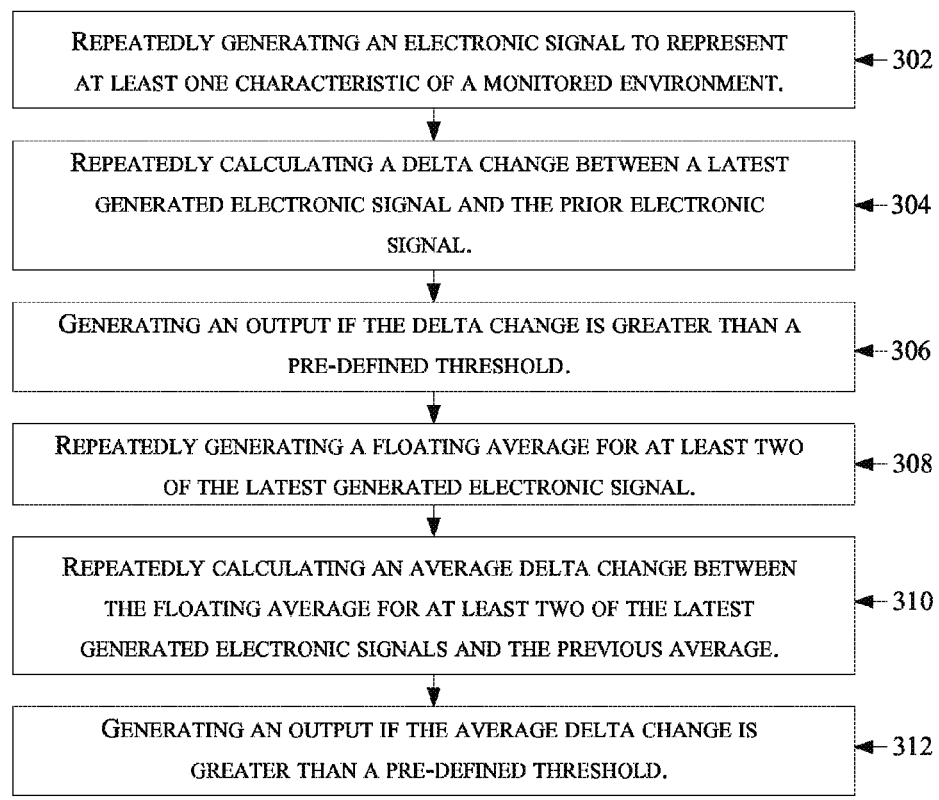
FIG. 3 is a flowchart of an exemplary method for monitoring an environment with a dynamically adjustable sensor in accordance with one embodiment of the present technology.

With reference now to FIG. 3, a flowchart 300 of one method for monitoring an environment with a dynamically self-adjusting sensor 260 is shown in accordance with one embodiment. For clarity in the following description, graphs 410-430 of FIG. 4 and graphs 510-540 of FIG. 5 are utilized in conjunction with Flowchart 300 to illustrate a number of the plurality of possible embodiments. At graph 410 of FIGS. 4 and 510 of FIG. 5 a characteristic of monitored environment 110 is shown over time period A-n. The characteristic may be an acoustic characteristic, visual characteristic, infrared characteristic, or the like.

In general, graph 410 is an example of at least one characteristic of monitored environment 110 as occurring over a time A-n. In the following examples, A-n are described as sample times. In other words, in one embodiment described herein, during each of time A-n sample module 220 generates a signal 130. As is apparent in graph 410, a small change occurs between times A-D and then a large change occurs between times E-G with a peak at time F. At time n, the characteristics of monitored environment 110 appear to return to the level prior to the spike at F. Thus, graph 410 may be an example of an event that showed up and then went away. The event could be a single event, or graph 410 may represent a single snippet of a repetitive event.

In one embodiment, graph 510 is an example of at least one characteristic of monitored environment 110 as occurring over a time A-n. In the following examples, A-n are described as sample times. In other words, in one embodiment described herein, during each of time A-n sample module 220 generates a signal 130. As is apparent in graph 510, little change occurs between times A-B and then a large change occurs between times C-D with a peak at time E that results in a leveling off of the characteristic at times E-n. At time n, the characteristics of monitored environment 110 appear to be stable at the new level. Thus, graph 510 may be an example of an event that showed up and then remained. Again, in one embodiment, the event could be a single event, or graph 510 may represent a single snippet of a repetitive event.

At 302 of FIG. 3, one embodiment repeatedly generates a signal 130 representing at least one characteristic of monitored environment 110. In one embodiment, signal 130 is generated by sample module 220 of FIG. 2.

Figure 4:
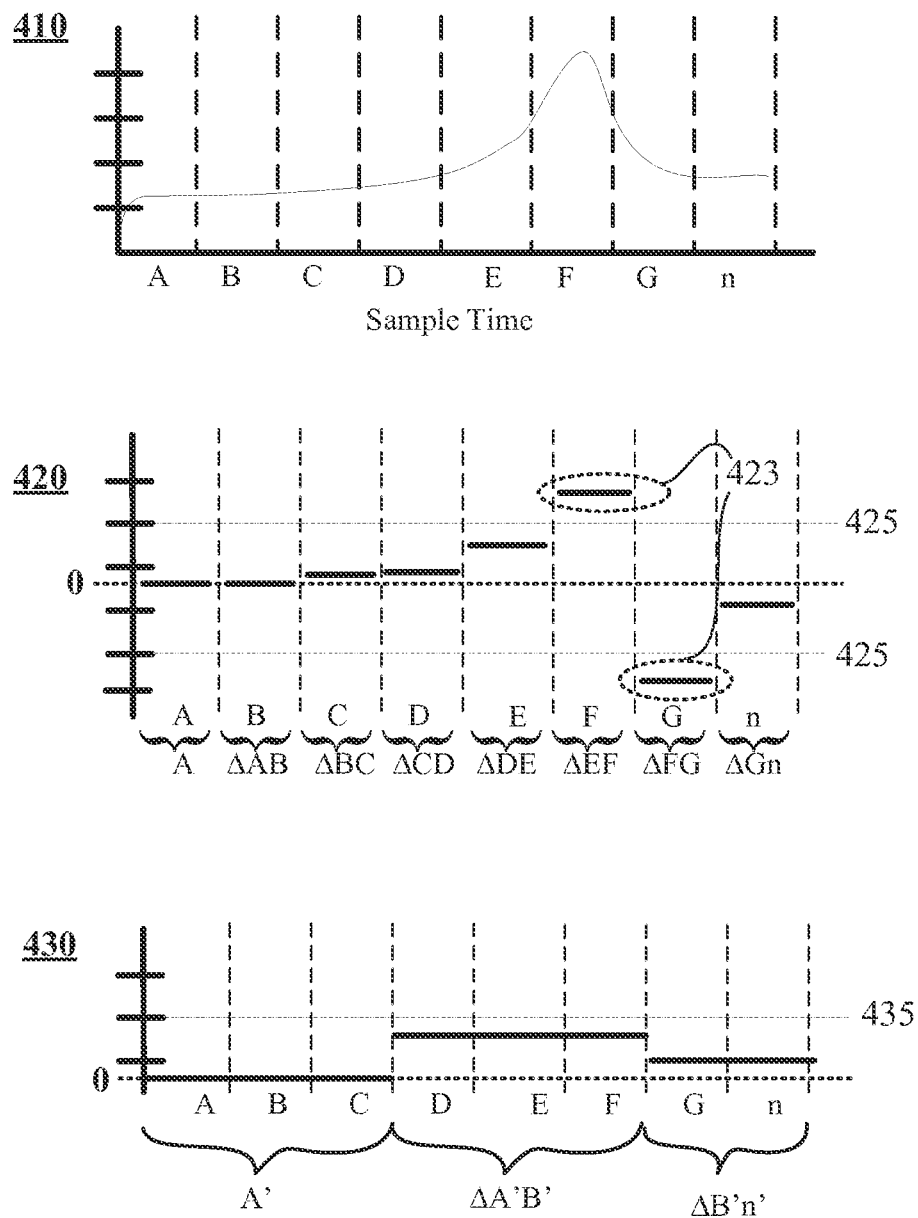
FIG. 4 is a plurality of graphs 410-430 illustrating one embodiment for monitoring an environment with a dynamically adjustable sensor in accordance with one embodiment of the present technology.
Figure 5:
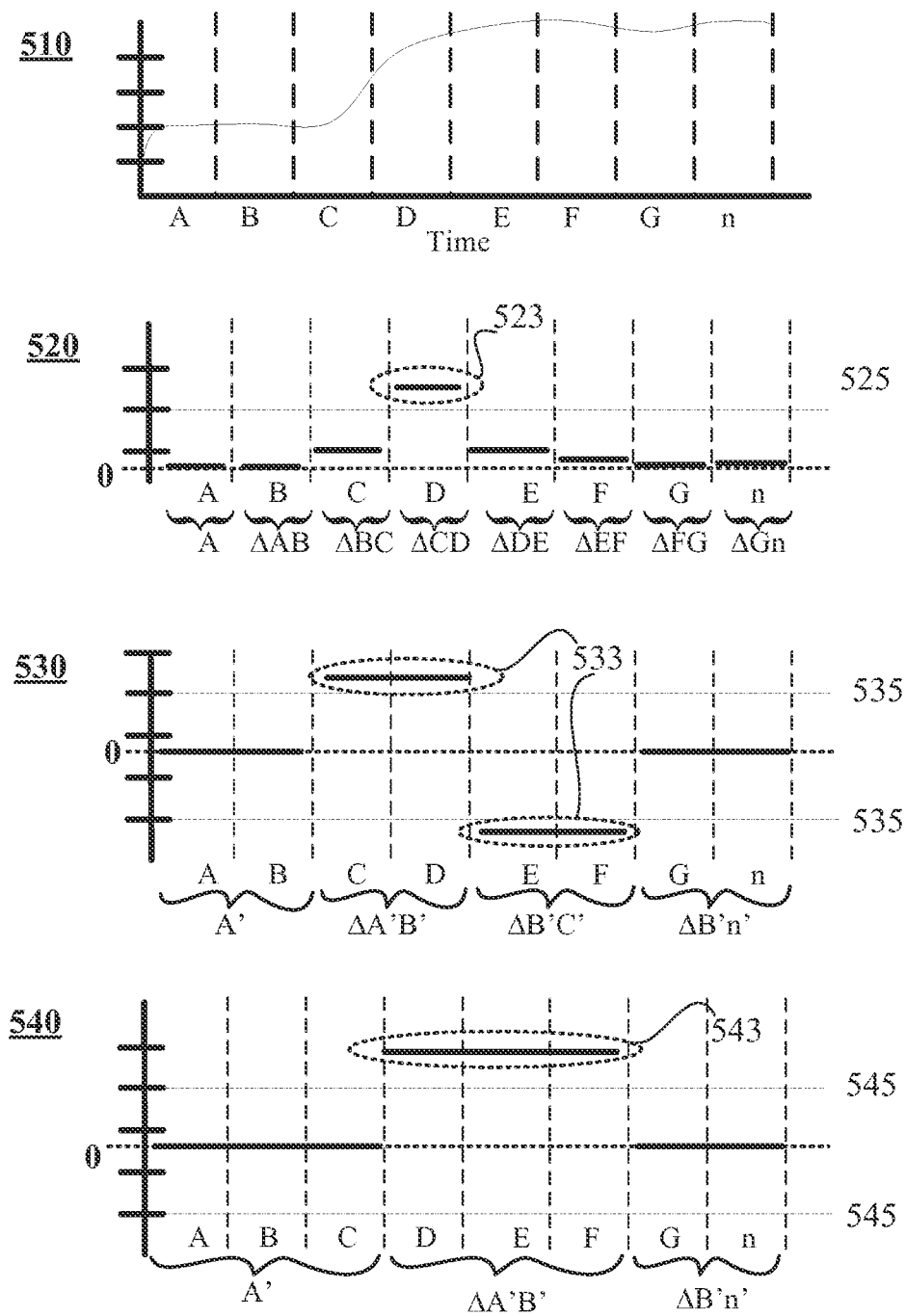
FIG. 5 is a plurality of graphs 510-540 illustrating another embodiment for monitoring an environment with a dynamically adjustable sensor in accordance with one embodiment of the present technology.

With reference now to 304 of FIG. 3 as well as graph 420 of FIG. 4 and 520 of FIG. 5, one embodiment repeatedly calculates a delta change between a latest generated electronic signal and the prior electronic signal. In other words, delta comparator module 230 receives signal 130 at given intervals from sample module 220 and compares the new signal with a previous signal. For example, after delta comparator module 230 receives at least a second signal, delta comparator module 230 will compare the two signals and generate a delta or difference between the two signals, as shown in graphs 420 and 520. Thus, since in one embodiment, delta comparator module 230 performs a comparison between the most recent signal and the next most recent signal, a dynamically self-adjusted baseline for the particular monitored environment 110 is maintained. Further, the delta value generated by delta comparator module 230 may be a relative value. As such, an explicit value for the signal 130 is not required.

For example, at graph 420 the change between A and B (AB) samples is minimal. Similarly, the difference between BC and CD are also minimal However, the change at sample time E and the spike at sample time F clearly show up on graph 420 at DE and DF. Further, at FG the end of the spike is also recognized while at Gn the spike appears to be gone and a baseline characteristic for monitored environment 110 appears to have returned.

In another example, at graph 520 the change between A and B (AB) samples is minimal. Similarly, the difference between BC is also minimal. However, the change at sample time C and sample time D are clearly shown on graph 520 at BC and CD. At DE the change in monitored environment 110 appears to stabilize and the characteristic for EF, FG and Gn show the lack of change in measured characteristics. Moreover, it is also noted that while the change may be provided in a positive and negative aspect such as shown in graph 420, absolute values for the differences may be used as shown in graph 520.

Referring now to 306 of FIG. 3, when the resultant difference between monitored environment 110 signals 130 is greater than or equal to a pre-defined difference threshold, dynamically self-adjusting sensor 260 provides a possible event 250 output. For example, at graph 420 the threshold value is shown as 425 and possible event 250 is output when the threshold is passed as illustrated at 423. Similarly, at graph 520 the threshold value is shown as 525 and possible event 250 is output when the threshold is passed as illustrated at 523.

With reference now to 308 of FIG. 3, one embodiment repeatedly generates a floating average for at least two of the latest generated electronic signals 130. For example, delta comparator module 230 may average signals 130 over a group of three sample time periods to generate average signal 145. In another embodiment, delta comparator module 230 may average received signals 130 over a 5 minute, 20 minute, 1 hour, 2 hour, 6 hour, 12 hour, 24 hour, etc. time period before generating average signal 145. In one embodiment, the length of time represented by average signal 145 may be directly related to the sensitivity and/or range of dynamically self-adjusting sensor 260.

With reference now to 310 of FIG. 3 as well as graph 430 of FIGS. 4 and 530 and 540 of FIG. 5, one embodiment repeatedly calculates an average delta change between the floating average signal 145 for at least two of the latest generated electronic signals 130 and the previous average signal 145. In one embodiment, floating average signal 145 refers to the methodology of averaging the signals 130. For example, if the floating average signal was based on the average of three signals, then the first average would be the average of signal A+signal B+signal C. However, the next floating average signal may be the average of signal B+Signal C+Signal D. Thus, although in some embodiments herein, for purposes of clarity, the averaging is per set of signals, the present technology is well suited to floating averages as well as block averages.

For example, as shown in graph 430 and 530, in one embodiment, delta comparator module 230 looks at the difference or change between average signal 145 A' and A'B'. In one embodiment, as shown in 430 the sensitivity of dynamically self-adjusting sensor 260 is not affected by the direction of a change in strength of monitored environment 110. In other words, the resultant change may be an absolute value of the change (e.g., as shown in 430). In another embodiment, the resultant change may maintain its direction of change characteristic such as shown in 530 of FIG. 5.

By utilizing a difference comparison (e.g., the difference between at least two signals 130, at least two average signals 145, and/or one or more signals 130 and one or more average signal 145), changes that occur in monitored environment 110 can be normalized to provide sensitivity for dynamically self-adjusting sensor 260. For example, if monitored environment 110 varies naturally over time, such as can occur during changes in the daily temperature, other machine noise, or the like, because the relative change is evaluated, monitored environment 110 variations may prompt an initial possible event 250, however if the event remains or becomes periodic, dynamically self-adjusting sensor 260 will dynamically adjust as shown in A'B' and B'n' of 430. In so doing, dynamically self-adjusting sensor 260 can be set to and will remain at a consistent and very high level of sensitivity. In one embodiment, the operational sensitivity of dynamically self-adjusting sensor 260 may be less than or equal to the natural variations in the environment's monitored environment 110.

When comparing graphs 420 and 430, it is clear that having a differing window size can affect the reaching of the threshold value. For example, although they represent the same monitored environment 110 characteristics. While the threshold 425 of graph 420 is breached at 423 causing a possible event 250, the threshold 435 of graph 430 is not breached. Thus, it is clear that sensitivity and false warnings may be dealt with by adjusting the window size of average signal 145. Further, although only one average signal 145 graph is shown at 430 (and only 2 are shown at 530 and 540), the present technology is well suited to having a plurality of window sizes. Further, the present technology is well suited to having a plurality of window sizes operating at the same time to obtain numerous levels of sensitivity.

In other words, the utilization of window module 240 as well as sample module 220 allows dynamically self-adjusting sensor 260 to maintain numerous levels of sensitivity to changes in monitored environment 110 at the same time. Thus, in one embodiment, by utilizing both sample module 220 and one or more window module 240, dynamically self-adjusting sensor 260 can have both a high level of sensitivity as well as a large field of range.

Referring now to 312 of FIG. 3, one embodiment generates a possible event 250 output when a difference in the comparing is greater than a threshold. For example, possible event 250 at 533 of graph 530 and possible event 250 at 543 of graph 540. In one embodiment, possible event 250 may be an audible mechanical and/or visual alarm configured to be heard by a human being. In an alternative embodiment, possible event 250 may be sent via a communication network to automatically notify designated personnel when an event is detected.

In another embodiment, possible event 250 may be received by another device that will carry out a follow-on task. For example, possible event 250 could provide a turn-on signal for one or more lights, such a light located in the vicinity of the detected event. Additionally, possible event 250 could include a signal to generate a notification of the detected event to a remote location. In one embodiment, possible event 250 may initiate an automatic action.

In one embodiment, dynamically self-adjusting sensor 260 wired or wirelessly transmits possible event 250 to a remote communications device by implementing a communication technology selected from a group of communication technologies consisting of AM, FM, multi-master serial single-ended computer bus such as Inter-Integrated Circuit ($I^2C$), PCM, GPS, RS232, RS485, USB, firewire, infrared and fiber optic communication technologies, and the like. The description of a number of communication technologies is provided herein for purposes of clarity; however, the technology is well suited to alternate communication methods in accordance with the present invention.

Moreover, dynamically self-adjusting sensor 260 is capable of operation in both an attended state and an unattended state. For example, dynamically self-adjusting sensor 260 is well suited to be placed in an environment that is constantly supervised, such as in a building, around machinery or the like. In another embodiment, dynamically self-adjusting sensor 260 is able to be "dropped" into an area to act as a standalone environment monitor. For example, dynamically self-adjusting sensor 260 may be placed in a location such as a closed hallway, off-limits area, or other environment that may be secluded or dangerous for human monitoring, and the like. In one embodiment, during operation in an unmanned operating environment, possible event 250 from dynamically self-adjusting sensor 260 may be communicated to a remote site.

Dynamically self-adjusting sensor 260 may also be expanded to include data storage for various purposes. For instance, in an embodiment, signal 130, average signal 145 and/or information generated by sample module 220, window module 240 and delta comparator module 230 may be stored in a storage unit such that the data may be subsequently retrieved and further processed. For example, a hard disk drive (HDD) or random access memory (RAM) is used to electronically store the data by means of arrays of electronic capacitors that are configured to acquire an electronic charge, wherein the charging of the capacitor arrays corresponds to a digital representation of the acquired data. However, it is understood that the aforementioned examples are merely exemplary of different storage units that may be implemented pursuant to various embodiments of the present technology. Other suitable storage units may also be utilized to store data such that it may be later accessed and processed. For instance, a portable flash drive may be used to store data, and the flash drive could be physically transported from a first computing system to a second computing system, wherein both computing systems are capable of accessing data stored on the drive.

Example Computing System

Figure 6:
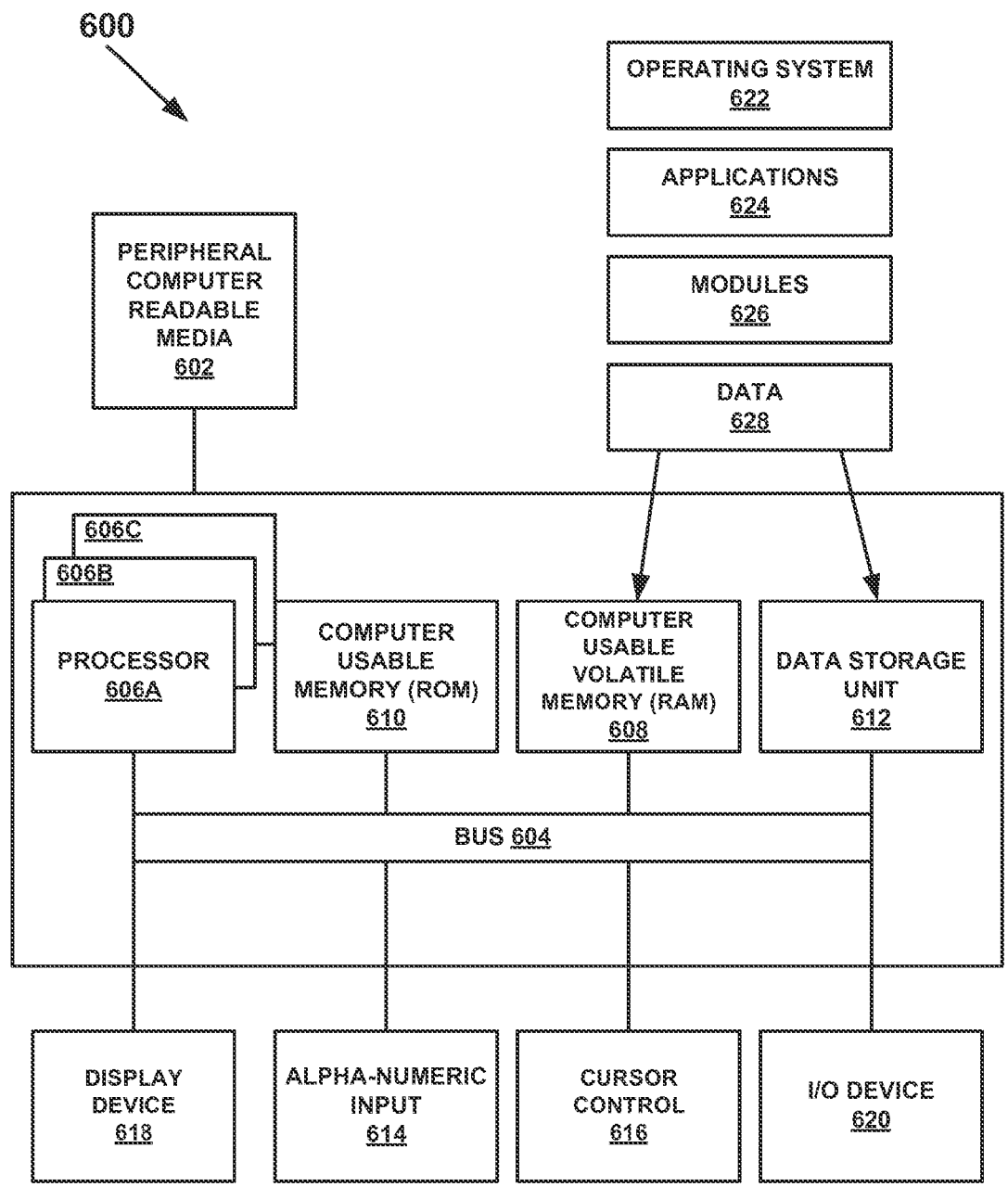
FIG. 6 is a block diagram of an exemplary computer system in accordance with one embodiment of the present technology.

With reference now to FIG. 6, portions of the technology may be composed of computer-readable and computer-executable instructions that reside, for example, on computer-usable media of a computer system. FIG. 6 illustrates an example of a computer system 600 that can be used in accordance with embodiments of the present technology. However, it is appreciated that systems and methods described herein can operate on or within a number of different computer systems including general purpose networked computer systems, embedded computer systems, routers, switches, server devices, client devices, various intermediate devices/nodes, standalone computer systems, and the like. For example, as shown in FIG. 6, computer system 600 is well adapted to having peripheral computer readable media 602 such as, for example, a floppy disk, a compact disc, flash drive, back-up drive, tape drive, and the like coupled thereto.

System 600 of FIG. 6 includes an address/data bus 604 for communicating information, and a processor 606A coupled to bus 604 for processing information and instructions. As depicted in FIG. 6, system 600 is also well suited to a multi-processor environment in which a plurality of processors 606A, 606B, and 606C are present. Conversely, system 600 is also well suited to having a single processor such as, for example, processor 606A. Processors 606A, 606B, and 606C may be any of various types of microprocessors. System 600 also includes data storage features such as a computer usable volatile memory 608, e.g. random access memory (RAM) (e.g., static RAM, dynamic, RAM, etc.) coupled to bus 604 for storing information and instructions for processors 606A, 606B, and 606C. System 600 also includes computer usable non-volatile memory 610, e.g. read only memory (ROM) (e.g., read only memory, programmable ROM, flash memory, EPROM, EEPROM, etc.), coupled to bus 604 for storing static information and instructions for processors 606A, 606B, and 606C. Also present in system 600 is a data storage unit 612 (e.g., a magnetic or optical disk and disk drive, solid state drive (SSD), etc.) coupled to bus 604 for storing information and instructions.

System 600 also includes an alphanumeric input device 614 including alphanumeric and function keys coupled to bus 604 for communicating information and command selections to processor 606A or processors 606A, 606B, and 606C. System 600 also includes a cursor control device 616 coupled to bus 604 for communicating user input information and command selections to processor 606A or processors 606B, and 606C. System 600 of the present embodiment also includes a display device 618 coupled to bus 604 for displaying information. In another example, alphanumeric input device 614 and/or cursor control device 616 may be integrated with display device 618, such as for example, in the form of a capacitive screen or touch screen display device 618.

Referring still to FIG. 6, optional display device 618 of FIG. 6 may be a liquid crystal device, cathode ray tube, plasma display device or other display device suitable for creating graphic images and alphanumeric characters recognizable to a user. Cursor control device 616 allows the computer user to dynamically signal the movement of a visible symbol (cursor) on a display screen of display device 618. Many implementations of cursor control device 616 are known in the art including a trackball, mouse, touch pad, joystick, capacitive screen on display device 618, special keys on alpha-numeric input device 614 capable of signaling movement of a given direction or manner of displacement, and the like. Alternatively, it will be appreciated that a cursor can be directed and/or activated via input from alpha-numeric input device 614 using special keys and key sequence commands. System 600 is also well suited to having a cursor directed by other means such as, for example, voice commands, touch recognition, visual recognition and the like. System 600 also includes an I/O device 620 for coupling system 600 with external entities. For example, in one embodiment, I/O device 620 enables wired or wireless communications between system 600 and an external network such as, but not limited to, the Internet.

Referring still to FIG. 6, various other components are depicted for system 600. Specifically, when present, an operating system 622, applications 624, modules 626, and data 628 are shown as typically residing in one or some combination of computer usable volatile memory 608, e.g. random access memory (RAM), and data storage unit 612.

Examples of well known computing systems, environments, and configurations that may be suitable for use with the present technology include, but are not limited to, personal computers, server computers, hand-held or laptop devices, multiprocessor systems, microprocessor-based systems, set-top boxes, programmable consumer electronics, network PCs, minicomputers, mainframe computers, distributed computing environments that include any of the above systems or devices, and the like.

It should be further understood that the examples and embodiments pertaining to the systems and methods disclosed herein are not meant to limit the possible implementations of the present technology. Further, although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

Magnetometer

Figure 7:
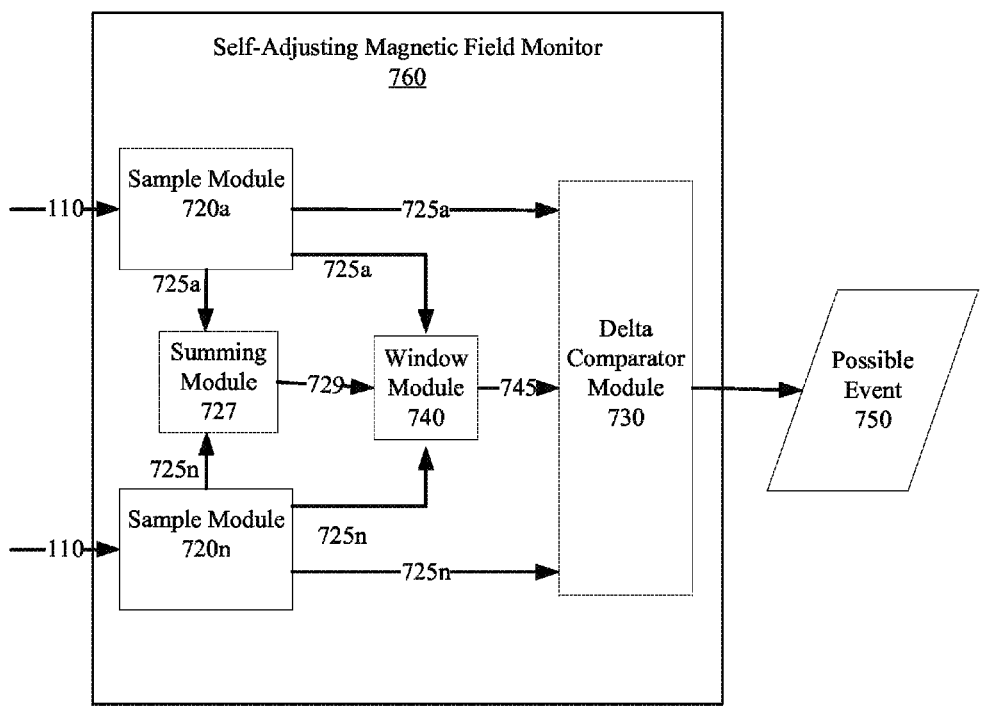
FIG. 7 is a block diagram of a self-adjusting magnetic field monitor shown in accordance with one embodiment of the present technology.

With reference now to FIG. 7, a block diagram 700 of a self-adjusting magnetic field monitor 760 is shown in accordance with one embodiment of the present technology. In one embodiment, self-adjusting magnetic field monitor 760 includes a sample module 720a, sample module 720n, summing module 727, delta comparator module 730, and window module 740.

The following description provides a number of embodiments for utilizing a self-adjusting magnetic field monitor 760. For purposes of clarity, in the following description aspects of the self-adjusting magnetic field monitor 760 that may be similar in function to that of self-adjusting sensor 260 will not be described in detail, but will refer to the operational characteristics previously described herein. However, it should be understood that the referral to the previous description is not provided as a limitation to that which has been previously described, but is instead provided as one example of the operation of a similarly functioning portion. Thus, aspects of the technology are well suited to variations, additions, permutations or the like.

In one embodiment, sample module 720a and sample module 720n sample monitored environment 110 periodically at a pre-defined rate of time and generate a corresponding signal 725a and 725n, respectively, for each sampling period. For example, sample modules 720a and 720n may generate new signals 725a and 725n every few milliseconds, few minutes, few seconds, few hours or the like. By adjusting the signal interval for sample module 720a and sample module 720n, both sensitivity and range of self-adjusting magnetic field monitor 760 may be adjusted. Although two sample modules are shown, the present technology is well suited to any number of sample modules. Moreover, as described in further detail herein, by adding additional sample modules, or channels, further levels of granularity and sensitivity can be obtained.

In one embodiment, the signals 725a and 725n generated by sample module 720a and sample module 720n, respectively, are oscillating signals at a frequency that is proportional to the ambient magnetic field of monitored environment 110. For example, the oscillation may be pulse shaped. In one embodiment, for each sample period, the signals 725a and 725n represent the frequency of the oscillation for the sample period. In another embodiment, signals 725a and 725n are the absolute value representing the frequency of the oscillation for the sample period.

In one embodiment, sample module 720a and sample module 720n output signals 725a and 725n, respectively to summing module 727, window module 740 and delta comparator module 730. In one embodiment, summing module 727 is utilized to sum the output of two or more sample modules. In so doing, the sensitivity of the self-adjusting magnetic field monitor 760 may be multiplied by the number of sample modules being utilized. In one embodiment output 729 from summing module 727 is provided to both window module 740 and also to delta comparator module 730. For example, in diagram 700, output 745 from window module 740 may include output 729.

Referring still to FIG. 7, in one embodiment, window module 740 provides an average signal 745 over a pre-defined number of signals 725a and 725n. The average signal 745 is provided to delta comparator module 730 and is utilized by delta comparator module 730 to detect changes in monitored environment 110. In one embodiment, the average signal 745 may include the average signal for signals 725a, the average signal for signals 725n and the average signals for signal 729.

In one embodiment, delta comparator module 730 receives signal 725a and 725n from sample module 720a and sample module 720n at given intervals. Delta comparator module compares each new signal with a previous signal. For example, looking only at sample module 720a, after delta comparator module 730 receives at least a second signal, delta comparator module 730 will compare the two signals and generate a delta or difference between the two signals, as shown and described in more detail in FIGS. 4-5 herein. Thus, since in one embodiment, delta comparator module 730 performs a comparison between the most recent signal and the next most recent signal, a dynamically self-adjusted baseline for the monitored environment 110 is maintained. Further, the delta value generated by delta comparator module 730 may be a relative value. As such, an explicit value for the signal 725a is not required. When the resultant difference between compared signals is greater than or equal to a pre-defined difference threshold, delta comparator module 730 provides a possible event 750 output.

With respect to average signal 745, in one embodiment, delta comparator module 730 receives average signal 745 from window module 740 and compares average signal 745 with a previous average signal 745. As stated herein, average signal 745 may include an average for signals 725a, 725n and 729. For example, after delta comparator module 730 receives at least a second average signal 745, delta comparator module 730 will compare the two average signals 745 and generate a delta or difference between the two average signals 745, as shown and described in more detail in FIGS. 4-5 herein. Again, since average signal 745 is compared with another average signal 745 and the change is utilized, the delta value generated by delta comparator module 730 may be a relative value. As such, an explicit value for average signal 745 is not required. In one embodiment, signals 725a and 725n may be compared to each other, to other signals generated by the sensor, or to one or more of the average signals 745. In addition, the value for average signal 745 may be tailored for different purposes by using different constituent signals to compose the average. When the resultant delta is greater than or equal to a pre-defined difference threshold, delta comparator module 730 outputs a tangible, concrete possible event 750. Examples of an output of possible event 750 include, but are not limited to, a printout, a visual and/or audio signal, an output to a graphical user interface (GUI), or the like.

As stated herein, in one embodiment, signals 725a, 725n, 729 and 745 do not need to include a specific or quantified value for monitored environment 110 as long as sample module 720a and sample module 720n provide a consistent representation of monitored environment 110. However, in another embodiment, signals 725a, 725n, 729 and/or average signal 745 may include a specified value related to the magnetic field of monitored environment 110.

In one embodiment, delta comparator module 730 may monitor a plurality of average signals 745 over time to detect changes in monitored environment 110 over time. In yet another embodiment, the functions described herein as being performed by a single delta comparator module 730 may be performed by more than one delta comparator module 730 or may be performed by the same device that performs the operations of sample module 720 and/or window module 740. However, for purposes of clarity, delta comparator module 730 is shown as a single module and is described herein as separate from sample module 720 and window module 740.

Figure 8A:
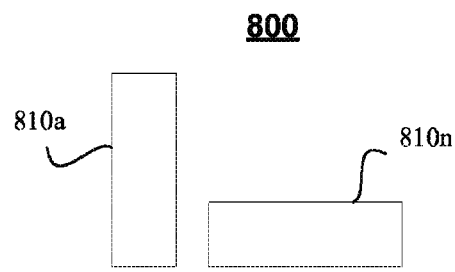
FIGS. 8A-8C are block diagrams of different sample module sensor element orientations shown in accordance with one embodiment of the present technology.
Figure 8B:
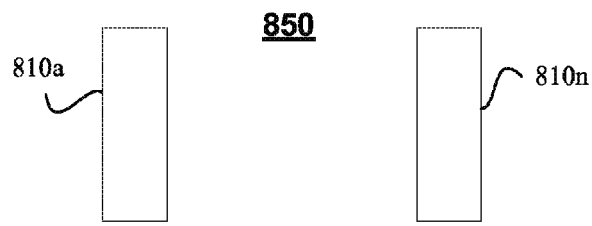
Figure 8C:
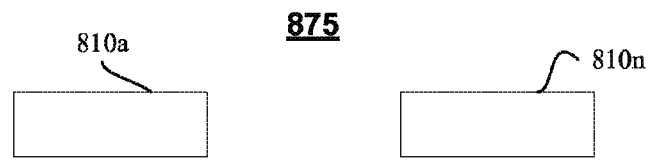

With reference now to FIGS. 8A-8C, block diagrams 800, 850 and 875 are provided to illustrate three of the plurality of different sample module sensor element orientations in accordance with one embodiment of the present technology. In the following discussion, sensor element 810a is utilized by sample module 720a and sensor element 810n is utilized by sample module 720n.

In general, the relative sensitivity to a given magnetic field change is a direct function of the orientation of the moving ferrous object to the sensor element. That is, with a given radial polarity, the sensor is very sensitive to the event on one axis and not as sensitive on the orthogonal axis. Basically, the individual sensor detection pattern for a given polarity follows a dual-law of cosines function.

FIG. 8A illustrates a first arrangement that includes sensor element 810a perpendicular to sensor element 810n. In one embodiment, by providing perpendicular orientation of the sensor elements, self-adjusting magnetic field monitor 760 will be sensitive in a circular pattern, regardless of the orientation or polarity of the event being detected.

FIGS. 8B and 8C illustrate a second and third parallel sensor element 810a and 810n arrangement. In contrast to the operation of the perpendicular orientation of the sensor elements, the parallel arrangement will provide a higher sensitivity in a first direction and a lower sensitivity in an orthogonal direction. In other words, by arranging the sensor elements in parallel, sensitivity and/or range of self-adjusting magnetic field monitor 760 may be multiplied for an event that occurs in a given direction with respect to the sensor orientation. However, it should be appreciated that the number of sample modules utilized by self-adjusting magnetic field monitor 760 may be more than two and as such a combination of sensor element orientations may be utilized. For example, a three sensor element configuration may include a combination of configuration 800 and configuration 875, or the like.

Figure 9:
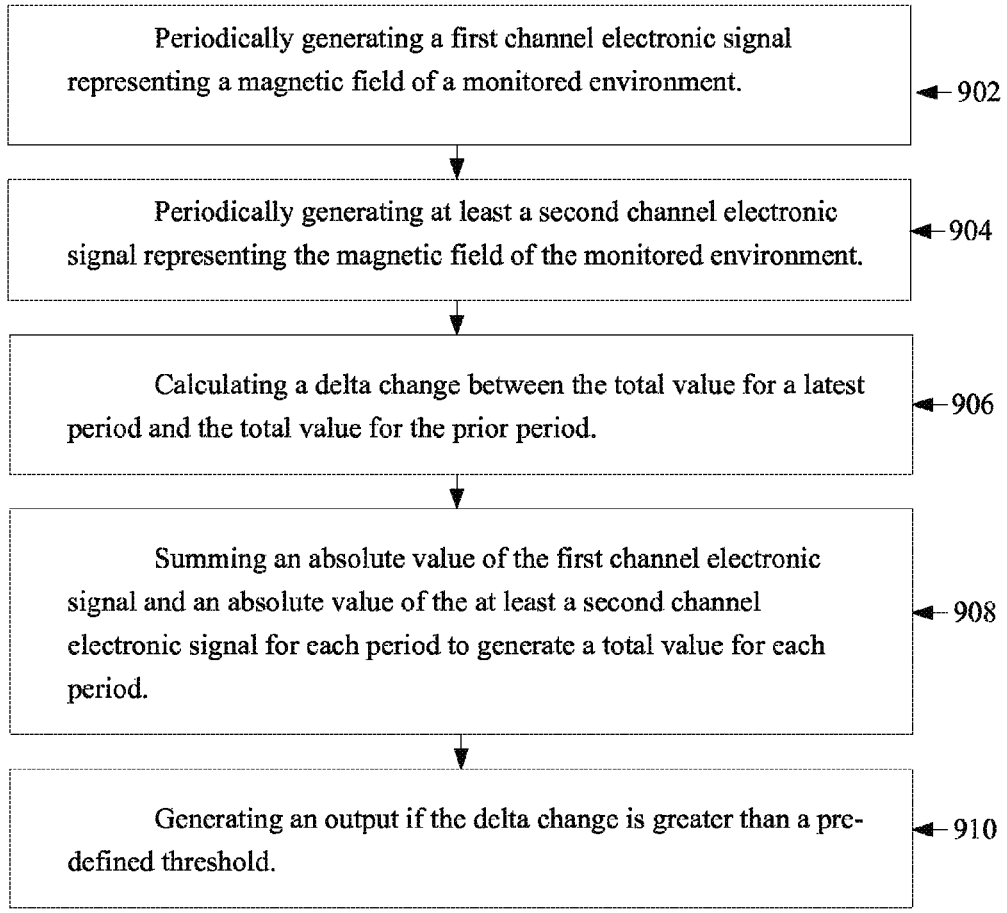
FIG. 9 is a flowchart of an exemplary method for monitoring an environment with a dynamically adjustable magnetometer in accordance with one embodiment of the present technology The drawings referred to in this description should be understood as not being drawn to scale except if specifically noted.

With reference now to FIG. 9, a flowchart of an exemplary method for monitoring an environment with a dynamically adjustable magnetometer is shown in accordance with one embodiment of the present technology.

At 902 of FIG. 9, one embodiment periodically generates a first channel electronic signal representing a magnetic field of a monitored environment. For example, as shown in FIG. 7, sample module 720a may generate a new signal 725a every few milliseconds, few minutes, few seconds, few hours or the like. By adjusting the signal interval for sample module 720a, both sensitivity and range of self-adjusting magnetic field monitor 760 may be adjusted.

In one embodiment, signal 725a, generated by sample module 720a, is an oscillating signal at a frequency that is proportional to the ambient magnetic field of monitored environment 110. For example, the oscillation may be pulse shaped. In one embodiment, for each sample period, the signal 725a may represent the frequency of the oscillation for the sample period. In another embodiment, signal 725a is the absolute value representing the frequency of the oscillation for the sample period.

At 904 of FIG. 9, one embodiment periodically generates at least a second channel electronic signal representing the magnetic field of the monitored environment. For example, as shown in FIG. 7, sample module 720n may generate a new signal 725n every few milliseconds, few minutes, few seconds, few hours or the like. By adjusting the signal interval for sample module 720n, both sensitivity and range of self-adjusting magnetic field monitor 760 may be adjusted.

In one embodiment, signal 725n, generated by sample module 720n, is an oscillating signal at a frequency that is proportional to the ambient magnetic field of monitored environment 110. For example, the oscillation may be pulse shaped. In one embodiment, for each sample period, the signal 725n may represent the frequency of the oscillation for the sample period. In another embodiment, signal 725n is the absolute value representing the frequency of the oscillation for the sample period.

Although two sample modules are shown, the present technology is well suited to any number of sample modules. Moreover, as described in further detail herein, by adding additional sample modules, or channels, further levels of granularity and sensitivity can be obtained.

At 906 of FIG. 9, one embodiment calculates a delta change between the total oscillation value for a latest period and the total oscillation value for the prior period. For example, as shown in FIG. 7, in one embodiment, delta comparator module 730 receives signal 725a and 725n from sample module 720a and sample module 720n. Delta comparator module compares each new signal 725a and 725n with a previous signal. For example, looking only at sample module 720a, after delta comparator module 730 receives at least a second signal 725a, delta comparator module 730 will compare the two signals 725a and generate a delta or difference between the two signals, as shown and described in more detail in FIGS. 4-5 herein. In one embodiment, signals 725a and 725n may be compared to each other, to other signals generated by the sensor, or to one or more of the average signals 745. In addition, the value for average signal 745 may be tailored for different purposes by using different constituent signals to compose the average.

At 908 of FIG. 9, one embodiment sums an absolute value of the first channel electronic signal and an absolute value of at least a second channel electronic signal for each period to generate a total value for each period. In one embodiment, as shown in FIG. 7, summing module 727 is utilized to sum the output of each sample module. In so doing, the sensitivity of the self-adjusting magnetic field monitor 760 may be multiplied by the number of sample modules being utilized.

Thus, since in one embodiment, delta comparator module 730 performs a comparison between the most recent signal 725a and the next most recent signal 725a, a dynamically self-adjusted baseline for the monitored environment 110 is maintained. Further, since signal 725a is compared with another signal 725a and the change is utilized, the delta value generated by delta comparator module 730 may be a relative value. As such, an explicit value for the signal 725a is not required. In one embodiment, signals 725a and 725n may be compared to each other, to other signals generated by the sensor, or to one or more of the average signals 745. When the resultant difference between compared signals 725a is greater than or equal to a pre-defined difference threshold, delta comparator module 730 provides a possible event 750 is output. In one embodiment, delta comparator module 730 may also utilize a matrix filter or stage filter and run the received electronic signals through the filter more than one time to generate a gain that will result in increased sensitivity.

At 910 of FIG. 9, one embodiment generates an output if the delta change is greater than a pre-defined threshold. For example, with respect to FIG. 7, when the resultant delta is greater than or equal to a pre-defined difference threshold, delta comparator module 730 outputs a tangible, concrete possible event 750. Examples of an output of possible event 750 include, but are not limited to, a printout, a visual and/or audio signal, an output to a graphical user interface (GUI), or the like.

In one embodiment, magnetic field monitor 760 is capable of operation in both an attended state and an unattended state. For example, magnetic field monitor 760 is well suited to be placed in an environment that is constantly supervised, such as a checkpoint, chokepoint, or the like. In another embodiment, magnetic field monitor 760 is able to be "dropped" into an area to act as a standalone environment monitor. For example, magnetic field monitor 760 may be placed in a location such as a closed hallway, off-limits area, front yard, driveway, room exit, building exit, parking garage, perimeter, and the like. In one embodiment, during operation in an unmanned operating environment, possible event 750 from magnetic field monitor 760 may be communicated to a remote site, may initiate an alarm, initiate a lock-down sequence, provide an activation signal to another device, and the like.

In general, magnetic field monitor 760 may be employed in desert, jungle, riverine, littoral and/or coastal regions. Furthermore, due to the self-calibrating characteristics, magnetic field monitor 760 is also capable of operating under a wide range of physical conditions such as, high humidity, low humidity, extreme temperature ranges, dusty, dirty, sandy and muddy conditions, partially or completely submerged, partially or completely buried, and the like. For example, magnetic field monitor 760 is capable of operating in environments with one or more significant physical conditions such as, but not limited to, tropical or arctic environments.

Additionally, magnetic field monitor 760 is capable of operation in environments having changing physical conditions. That is, the repetitive self-calibrating capabilities of magnetic field monitor 760 allow magnetic field monitor 760 to remain viable in a constantly changing environment such as a desert environment that may have daily or weekly environmental changes (e.g., temperatures that range from at or below freezing at night to 40 degrees Celsius midday). In another embodiment, magnetic field monitor 760 is also well suited for operation in a controlled environment having little or no harsh physical conditions, such as an airport terminal, building, parking lot and the like.

In another embodiment, magnetic field monitor 760 is also very useful in an environment where a walk-through or hand-held metal detector is utilized. Although, as stated herein, magnetic field monitor 760 is well suited as a replacement for either or both of the walk-through and hand-held metal detector, due to the distinctly different approach of monitoring an environments magnetic field, magnetic field monitor 760 is also well suited for use in conjunction with a walk-though and/or hand-held metal detector. For example, in many security environments people are formed up in queue to pass through the checkpoint. In addition, some checkpoints such as metal-detection checkpoints provide a chokepoint with many unscreened people waiting to pass through the metal-detector. The present security checkpoints do not provide security for people waiting to pass through. Moreover, in higher stress environments security personnel are on lookout for people that appear stressed or people dressed in loose clothing that are approaching the checkpoint. In some environments, a human evaluation may be utilized by security personnel prior to a suspicious person even entering the screening queue. For example, a security guard may have to ask someone to open up the baggy shirt or answer a few questions.

However, magnetic field monitor 760 may be deployed in this same scenario as a means of pre-scanning anyone or anything approaching the checkpoint. For example, in one embodiment, magnetic field monitor 760 may be set to output signal 750 if an event is detected within a pre-defined area around the checkpoint. Such a pre-warning would allow anyone at the checkpoint to react to the event with an amount of stand-off distance. Further, in one embodiment, when used in combination with a walk-through metal detector, magnetic field monitor 760 may be calibrated to increase range while sacrificing some sensitivity since the walk-through metal detector may be providing the finer level of sensitivity.

Although a walk-through or hand-held metal detector is utilized in the example, it is merely as an example of one way magnetic field monitor 760 may be incorporated into a previously established screening scenario. In yet another embodiment, magnetic field monitor 760 may act as both the long range and fine level detector in a similar checkpoint without requiring any other type of metal detection system.

In one embodiment, by utilizing two or more magnetic field sensors 720, magnetic field monitor 760 is also capable of determining additional information relating to an event, information such as speed, direction, velocity, etc.

What is claimed is:

1. A computer-implemented method for monitoring an environment with a dynamically adjustable magnetometer, said method comprising:
    periodically generating a first channel electronic signal representing a magnetic field of a monitored environment;
    periodically generating at least a second channel electronic signal representing said magnetic field of said monitored environment;
    calculating a delta change between the total value for a first period and the total value for a second period;
    summing an absolute value of said first channel electronic signal and an absolute value of said at least a second channel electronic signal over a period to generate a total value for a first period and the total value for a second period;
    generating an output if said total value is greater than a pre-defined threshold;
    utilizing an average total value for more than two periods to repeatedly generate a second floating average;
    calculating an average delta change between two different period second floating averages; and
    generating said output if the average delta change is greater than a pre-defined threshold.

2. The computer-implemented method of claim 1, wherein said periodically generating a first channel electronic signal is performed by a magnetic field sensor selected from the group consisting of: a fluxgate sensor, a magneto inductive sensor, a magneto resistive sensor, a Cesium vapor, and a skinning induction-effect sensor.

3. The computer-implemented method of claim 1 further comprising:
    utilizing an oscillation frequency over a period of time to periodically generate said first channel electronic signal and said second channel electronic signal.

4. The computer-implemented method of claim 1 further comprising:
    converting said first channel electronic signal and at least said second channel electronic signal from an analog signal to a digital signal.

5. The computer-implemented method of claim 1 further comprising:
    utilizing the average total value for at least two of the latest periods to repeatedly generate a floating average;
    calculating an average delta change between a first period floating average and a second period floating average; and
    generating said output if the average delta change is greater than a pre-defined threshold.

6. The computer-implemented method of claim 1 wherein the output is selected from the group consisting of: a printout, a visual signal, an audio signal, and an output to a graphical user interface (GUI).

7. Instructions on a non-transitory computer-usable medium wherein the instructions when executed cause a computer system to perform a method for monitoring an environment with a dynamically adjustable sensor, said method comprising:
    periodically generating a first channel electronic signal representing a magnetic field of a monitored environment;
    periodically generating a first channel average electronic signal representing an average of two or more of said periodically generated first channel electronic signals;
    calculating a delta change between two of said electronic signals wherein said two of said electronic signals utilized when calculating said delta change are selected from the group consisting of:
        a first channel electronic signal from a first period and a first channel electronic signal from a second period,
        said first channel electronic signal from said first period and a first channel average electronic signal from a first period,
        said first channel electronic signal from said first period and a first channel average electronic signal from a second period, and
        said first channel average electronic signal from a first period and a first channel average electronic signal from a second period; and
    generating an output if said delta change is greater than or equal to a pre-defined threshold.

8. The non-transitory computer-usable medium of claim 7 further comprising:
    periodically generating at least a second channel electronic signal representing said magnetic field of said monitored environment;
    calculating a delta change between the total value for a first period and the total value for a second different period;
    summing an absolute value of said first channel electronic signal and an absolute value of said at least a second channel electronic signal for each period to generate a total value for each said period; and
    generating an output if said delta change is greater than a pre-defined threshold.

9. The non-transitory computer-usable medium of claim 8 further comprising:
    utilizing the average total oscillation value for at least two periods to repeatedly generate a floating average;
    calculating an average delta change between a first period floating average and a second different period floating average; and generating said output if the average delta change is greater than a pre-defined threshold.

10. The non-transitory computer-usable medium of claim 9 further comprising:
utilizing an average total value for more than two periods to repeatedly generate a second floating average;
calculating an average delta change between a first period second floating average and a second different period second floating average; and
generating said output if the average delta change is greater than a pre-defined threshold.

* * * * *